(12) United States Patent
Lim

(10) Patent No.: US 9,286,981 B2
(45) Date of Patent: Mar. 15, 2016

(54) SEMICONDUCTOR DEVICE AND METHOD FOR OPERATING THE SAME

(71) Applicant: SK HYNIX INC., Icheon (KR)

(72) Inventor: Sang Oh Lim, Icheon (KR)

(73) Assignee: SK HYNIX INC., Icheon (KR)

( * ) Notice: Subject to any disclaimer, the term of this patent is extended or adjusted under 35 U.S.C. 154(b) by 37 days.

(21) Appl. No.: 14/166,775

(22) Filed: Jan. 28, 2014

(65) Prior Publication Data

US 2015/0109841 A1 Apr. 23, 2015

(30) Foreign Application Priority Data

Oct. 21, 2013 (KR) ........................ 10-2013-0125146

(51) Int. Cl.
*G11C 11/34* (2006.01)
*G11C 15/04* (2006.01)
*G11C 8/06* (2006.01)
*G11C 5/14* (2006.01)
*G11C 16/10* (2006.01)
*G11C 16/20* (2006.01)

(52) U.S. Cl.
CPC ................ *G11C 15/046* (2013.01); *G11C 5/14* (2013.01); *G11C 8/06* (2013.01); *G11C 16/102* (2013.01); *G11C 16/105* (2013.01); *G11C 16/20* (2013.01)

(58) Field of Classification Search
USPC .............................. 365/49.01, 189.05, 185.12
See application file for complete search history.

(56) References Cited

U.S. PATENT DOCUMENTS 8,278,992 B2    10/2012  Kim et al.
2010/0328979 A1*  12/2010  Park ........................... 365/49.1
2012/0140572 A1*   6/2012  Kim et al. ................ 365/189.05
2013/0163332 A1*   6/2013  Cha .......................... 365/185.12

FOREIGN PATENT DOCUMENTS

KR    10-2008-0024370 A    3/2008

* cited by examiner

*Primary Examiner* — Anthan Tran

(57) ABSTRACT

A semiconductor device comprises a memory block having a content addressable memory (CAM) cell array storing data for internal operation conditions, and a memory cell array. The semiconductor device also comprises a page buffer to program data in the memory block or read the data programmed in the memory block; a control logic to activate a reset enable signal for initializing the page buffer during a reset operation and output the activated reset enable signal; and a power-supply controller to output a reset control signal for initializing the page buffer when the reset enable signal is activated, and provide a page buffer power-supply signal to the page buffer. The power-supply controller provides the page buffer power-supply signal after initialization of the page buffer.

17 Claims, 7 Drawing Sheets

SEMICONDUCTOR DEVICE AND METHOD FOR OPERATING THE SAME

CROSS-REFERENCE TO RELATED APPLICATION

This application claims priority based upon Korean patent application No. 10-2013-0125146, filed on Oct. 21, 2013, the disclosure of which is hereby incorporated by reference in its entirety herein.

BACKGROUND

Embodiments of the present disclosure relate to a semiconductor device and a method for operating the same, and more particularly to a technology for reducing a power-up current of the semiconductor device.

Generally, a semiconductor memory system receives a write command or a read command from a host. Therefore, the memory controller may be controlled to program or read data in a corresponding cell of a memory cell region.

Memory devices are classified into a volatile memory device and a non-volatile memory device according to whether data is retained or not when a power supply is cut off. As electronic devices become smaller and consume less power, flash memory devices from among non-volatile memory devices have been widely used in various electronic devices.

A flash memory device is one type of an electrically erasable and programmable read-only memory (EEPROM) in which multiple memory regions can be erased or programmed by one program action. A typical EEPROM can allow one memory region can be erased or programmed at once.

The above-mentioned characteristics indicate that the flash memory device can operate more quickly and more effectively than various systems using other types of memory devices. Flash memories and EEPROMs can become deteriorated after performing a predetermined number of programming or erasing operations, due to wear of insulation films enclosing a charge storage part configured to store data.

The flash memory device retains stored information even when the device is not powered. Although a power supply is cut off, the flash memory device can retain the stored information without power consumption.

In addition, since the flash memory device has strong resistance to a physical impact and has a fast read access speed, the flash memory device has been widely used as a storage media of mobile devices. Due to the aforementioned characteristics, the flash memory device has been used as a storage unit of devices receiving power from a battery.

The flash memory devices are classified into two types (i.e., a NOR type and a NAND type), according to types of logic gates used in each storage unit.

Flash memory devices may be configured to store information in an array of transistors called cells, each of which may store 1-bit information. On the other hand, some flash memory devices (e.g., multi-level cell devices) may store two or more bits in each cell by changing the amount of charges on a floating gate of each cell.

A memory cell region of the flash memory device comprises a plurality of strings. Each string may comprise a plurality of memory cells coupled in series to each other and select transistors formed at both ends of the memory cells. Memory cells formed in different strings may be electrically coupled to each other through a word line.

In addition, individual strings can be electrically coupled to a page buffer configured to sense data through a bit line. In order to record data in such a selected memory cell, the program and the verification operations are repeated a predetermined number of times equal to or less until data temporarily stored in the page buffer is programmed in the selected memory cell.

If a programming voltage is applied to a control gate of the memory cell, a tunneling phenomenon occurs in a floating gate so that a programming operation is carried out. In addition, if an erase voltage is applied to a bulk of the memory cell, the tunneling phenomenon occurs in the floating gate so that an erase operation is carried out. For example, a programming voltage is applied to a memory cell through a word line.

If a power-up operation is performed by the above-mentioned non-volatile memory device, latches contained in the page buffer may be initialized to prevent a short-circuit current. When these latches are initialized, a peak current may flow in the page buffer during the power-up operation.

Since the above-mentioned non-volatile memory device receives a reset signal after a power has been applied to the non-volatile memory device, a high peak current may occur in the non-volatile memory device. As a result, a power-supply voltage may become unstable so that the semiconductor device may malfunction.

If the peak current occurs while the power-supply voltage applied to the semiconductor device gradually increases, the likelihood of an occurrence of the malfunction of the semiconductor device may also increase. As a result, it is desirable that the page buffer maintains a low-current state during the power-up operation mode.

SUMMARY

Various embodiments of the present disclosure are directed to providing a semiconductor device and a method for operating the same that substantially address one or more issues due to limitations and disadvantages of the related art.

Embodiments relate to a semiconductor device in which a power-supply input time at which the page buffer is powered on, is controlled to reduce a peak current of the page buffer latch during the power-up operation.

According to an embodiment, a semiconductor device comprises: a memory block comprising not only a content addressable memory (CAM) cell array storing data for internal operation conditions but also a memory cell array; a page buffer suitable for program data in the memory block or read the data programmed in the memory block; a control logic suitable for activate a reset enable signal for initializing the page buffer during a reset operation, and output the activated reset enable signal; and a power-supply controller suitable for output a reset control signal for initializing the page buffer when the reset enable signal is activated, and provide a page buffer power-supply signal to the page buffer after initialization completion of the page buffer.

According to an embodiment, a method for operating a semiconductor device comprises: receiving a power-on reset signal in response to an external power-supply signal, and controlling the power-on reset signal to be disabled; activating a reset enable signal in response to a reset command; reading content addressable memory (CAM) data of a CAM cell array suitable for store data for internal operation conditions; initializing latches of a page buffer in response to the reset enable signal; and applying a page buffer power-supply signal to the page buffer.

According to an embodiment, a method for operating a semiconductor device comprises: receiving a power-on reset signal in response to an external power-supply signal; activating a reset enable signal when the power-on reset signal is disabled; reading content addressable memory (CAM) data of a CAM cell array suitable for store data for internal operation conditions; initializing latches of a page buffer in response to the reset enable signal; and applying a page buffer power-supply signal to the page buffer.

It is to be understood that both the foregoing general description and the following detailed description of the present disclosure are exemplary and explanatory and are intended to provide further explanation of the invention as claimed.

BRIEF DESCRIPTION OF THE DRAWINGS

The above and other features and advantages of the present disclosure will be apparent by reference to the following detailed description when considered in conjunction with the accompanying drawings wherein.

DESCRIPTION OF EMBODIMENTS

Reference will now be made in detail to various embodiments of the present disclosure, examples of which are illustrated in the accompanying drawings. Wherever possible, the same reference numbers will be used throughout the drawings to refer to the same or like parts.

Figure 1:
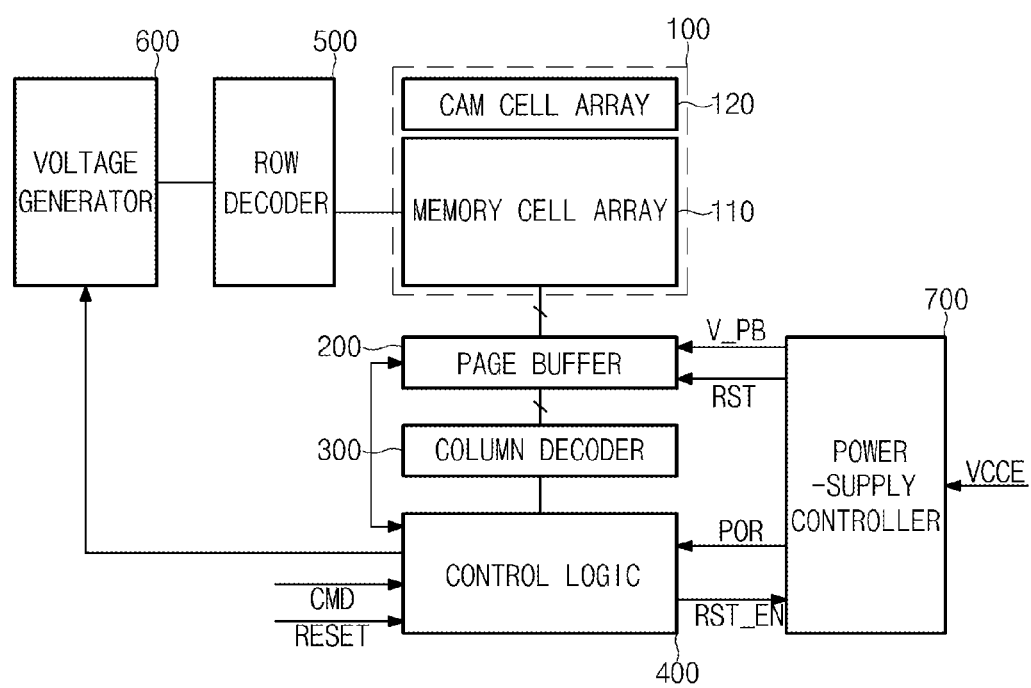
FIG. 1 is a block diagram illustrating a semiconductor device according to an embodiment.

FIG. 1 is a block diagram illustrating a semiconductor device according to an embodiment.

Referring to FIG. 1, the semiconductor device according to the embodiment comprises a memory block 100, a page buffer 200, a column decoder 300, a control logic 400, a row decoder 500, a voltage generator 600, and a power-supply controller 700.

The memory block 100 comprises a memory cell array 110 and a content addressable memory (CAM) cell array 120. In an embodiment, the memory cell array 110 and the CAM cell array 120 have substantially the same structure and characteristics.

The memory cell array 110 comprises a plurality of memory cells suitable for store program data. A plurality of memory cells may be coupled to word lines and bit lines. In an embodiment, the memory cell array 110 has a NAND string structure.

The CAM cell array 120 stores information regarding a non-volatile memory device. In an embodiment, the CAM cell array 120 is a circuit for storing option information desired for operating the semiconductor memory device, for example, program voltage information, read voltage information, erase voltage information, gate oxide film thickness information of a cell, and the like. In addition, the CAM cell array 120 may store address information identifying a defective block and repair information.

In conventional semiconductor memory devices, a fuse unit has been used to store various types of additional information desired for operations of the semiconductor memory device. The additional information may comprise various types of information desired for operations of the semiconductor memory device, for example, a value indicating characteristics of a memory cell, program pulses used in a program or erase operation, information regarding a value of an erase pulse, repair information, and the like.

However, the fuse unit may have the following issues. For example, the fuse unit is large in size. In addition, if a package process is performed after data has been stored, then it is difficult to change the data stored in the fuse unit. In order to address these issues, the CAM cell array 120, instead of the fuse unit, may be used in the memory block 100. In an embodiment, the CAM cell array 120 has substantially the same configuration and functionalities as those of the memory cell array 110. If additional information is stored in the CAM cell array 120, the additional information may be changed after performing a packing process.

The page buffer 200 is coupled to a plurality of bit lines of the memory cell array 110. The page buffer 200 may sense a plurality of bit line potentials during a read operation of the memory cell array 110, and may output read data corresponding to the sensed potentials to the column decoder 300. The page buffer 200 may temporarily store data to be programmed in the selected memory cell array 110, and may read and store the data programmed in the selected memory cell array 110.

The page buffer 200 may operate as a write driver or a sense-amplifier according to an operation mode. For example, the page buffer 200 may operate as the sense-amplifier in a read operation mode, and may operate as the write driver in a program operation mode.

The page buffer 200 may be suitable for read or program 1-bit data. In an embodiment, the page buffer 200 is suitable for read or program 2-bit data.

However, the scope of the page buffer 200 is not limited thereto. For example, the page buffer 200 may be suitable for read or program data of 3 bits or more.

In addition, the page buffer 200 may operate upon receiving a page buffer power-supply signal V_PB and a reset control signal RST from the power-supply controller 700. The page buffer 200 may initialize latches contained in the page buffer 200 in response to the reset control signal RST and may operate in response to the page buffer power-supply signal V_PB.

In an embodiment, the page buffer 200 is initialized in response to the reset control signal RST after an auto-read operation of the CAM cell array 120 has been completed. The reset control signal RST is input to the page buffer 200 for initializing latches of the page buffer 200. After a predetermined time elapses from the initialization, the page buffer power-supply signal V_PB is applied to the page buffer 200. Since the page buffer 200 operates according to an additional power-supply signal after an internal power-supply signal has been applied to the semiconductor device, a peak current generated in the latches of the page buffer 220 can be reduced.

The column decoder 300 may be suitable for select the page buffers 200 on the basis of a predetermined unit. For example, the column decoder 300 may select columns in response to corresponding column addresses on the basis of the predetermined unit.

The control logic 400 may control the semiconductor device to enter a busy state or a ready state upon receiving a command signal CMD from an external part. The control logic 400 receives a power-on reset signal POR from the power-supply controller 700, and outputs a reset enable signal RST_EN to the power-supply controller 700. In addition, the control logic 400 may output the reset enable signal RST_EN to the power-supply controller 700 upon receiving a reset signal RESET from an external part.

For example, when the power-on reset signal POR is disabled (or deactivated), the control logic 400 activates the reset enable signal RST_EN to output the activated reset enable signal RST_EN to the power-supply controller 700. In addition, when the reset signal RESET is activated, the control logic 400 activates the reset enable signal RST_EN to output the activated reset enable signal RST_EN to the power-supply controller 700.

The row decoder 500 selects one of the memory blocks, and selects one of rows (or pages) of the selected memory block 100. For example, the row decoder 500 selects a word line of the memory block 100 in response to a row address.

The row decoder 500 may provide program and verification voltages to a word line selected in response to a drive voltage of the voltage generator 600. During a program operation, the row decoder 500 may provide a program voltage to the selected word line, and may provide a pass voltage to non-selected word lines.

In addition, the row decoder 500 may provide read voltages to the selected word line during a read operation. The selected row (page) may be driven by the row decoder 500 in response to a drive voltage from the voltage generator 600.

The voltage generator 600 may be suitable for generate various drive voltages. Here, the drive voltage may comprise a program voltage, an erase voltage, a read voltage, a program/erase verification voltage, a refresh verification voltage, and the like.

The voltage generator 600 may generate different levels of voltage in response to a control signal output from the control logic 400. For example, a refresh verification voltage may be determined according to a memory region to be refreshed in the memory block 100.

The power-supply controller 700 may provide a power-supply signal to the page buffer 200 after the CAM cell array 120 has performed an auto-read operation according to a control signal of the control logic 400. In an embodiment, the power-supply controller 700 receives an external power-supply signal VCCE, and outputs a power-on reset signal POR to the control logic 400. Upon receiving the reset enable signal RST_EN from the control logic 400, the power-supply controller 700 may output a reset control signal RST for initializing latches of the page buffer 200. In addition, the power-supply controller 700 enables (or activates) the reset control signal RST for initializing latches of the page buffer 200, and then provides a page buffer power-supply signal V_PB to the page buffer 200.

As described above, a power-supply signal (e.g., the page buffer power-supply signal V_PB) according to an embodiment is separately applied to the page buffer 200 to reduce a peak current used for initialization of the page buffer 200 in an external power-up operation. In this embodiment, the term "external power-up operation" indicates that a power-supply signal (e.g., the external power-supply signal VCCE) is applied to a semiconductor device to operate the semiconductor device from an external node. Therefore, the page buffer 200 does not receive a power-supply signal when the external power-supply signal VCCE is received by the power-supply controller 700.

Instead, the page buffer power-supply signal V_PB is applied to the page buffer 200 after the CAM cell array 120 has performed the auto-read operation. Accordingly, a peak current caused by initialization of the page buffer 200 does not occur during the external power-up operation.

Figure 2:
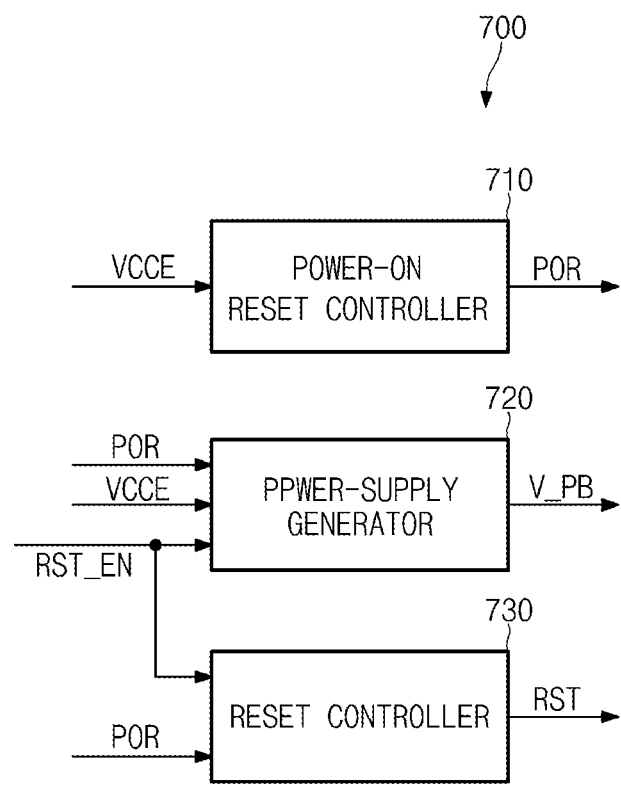
FIG. 2 is a detailed circuit diagram illustrating a power-supply controller shown in FIG. 1.

FIG. 2 is a detailed circuit diagram illustrating the power-supply controller 700 shown in FIG. 1.

Referring to FIG. 2, the power-supply controller 700 comprises a power-on reset controller 710, a power-supply generator 720, and a reset controller 730.

The power-on reset controller 710 receives an external power-supply signal VCCE, and outputs the power-on reset signal POR to the control logic 400 (see FIG. 1), the power-supply generator 720, and the reset controller 730. Here, a voltage level of the power-on reset signal POR increases in response to an external power-supply signal VCCE during an initial operation. If the external power-supply signal VCCE reaches a specific stabilization level, the power-on reset signal POR is disabled (or deactivated).

The power-supply generator 720 receives the power-on reset signal POR, the external power-supply signal VCCE, and a reset enable signal RST_EN, and provides a page buffer power-supply signal V_PB to the page buffer 200. After the power-supply generator 720 has received the reset enable signal RST_EN to start the latch initialization operation of the page buffer 200, the power supply generator 720 provides the page buffer power-supply signal V_PB to the page buffer 200.

The reset controller 730 may output the reset control signal RST for initializing latches of the page buffer 200 in response to the power-on reset signal POR and the reset enable signal RST_EN. In an embodiment, if the reset enable signal RST_EN is activated to a high level, the reset controller 730 activates the reset control signal RST and outputs the activated reset control signal RST to the page buffer 200.

Figure 3:
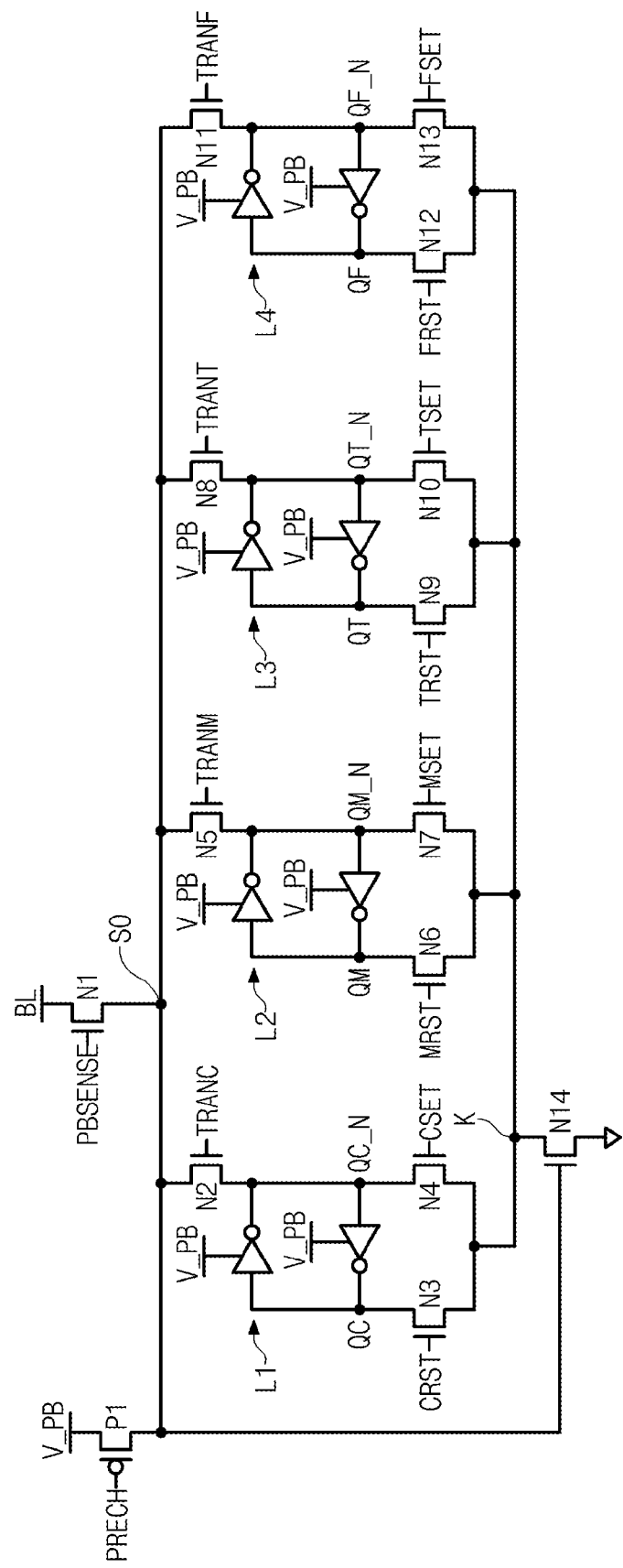
FIG. 3 is a detailed circuit diagram illustrating a page buffer shown in FIG. 1.

FIG. 3 is a detailed circuit diagram illustrating the page buffer 200 shown in FIG. 1.

Referring to FIG. 3, the page buffer 200 comprises first to $14^{th}$ NMOS transistors N1 to N14, a PMOS transistor P1, and first to fourth latches L1 to L4. In an embodiment, the first to fourth latches L1 to L4 are latch circuits contained in the page buffer 200 to temporarily store data for operation of the semiconductor device.

In this embodiment, the first NMOS transistor N1 is coupled between a bit line BL and a sensing node SO, and a sensing signal PBSENSE is input to a gate of the first NMOS transistor N1. One terminal of the PMOS transistor P1 is coupled to the sensing node SO, and the PMOS transistor P1 receives a precharge signal PRECH at the gate and the page buffer power-supply signal V_PB at the other terminal of the PMOS transistor P1.

The second NMOS transistor N2 is coupled between the sensing node SO and a first node QC_N, and a first transmission (Tx) signal TRANC is input to a gate of the second NMOS transistor N2. The first latch L1 is a cache latch coupled between the first and second nodes QC_N and QC. The first latch L1 receives data from the sensing node SO as an input.

The third NMOS transistor N3 is coupled between the second node QC and a third node K, and the fourth NMOS transistor N4 is coupled between the first node QC_N and the third node K. A first reset signal CRST is input to a gate of the third NMOS transistor N3, and a first set signal CSET is input to a gate of the fourth NMOS transistor N4. The third and fourth NMOS transistors N3 and N4 may operate to change data of the first latch L1.

The fifth NMOS transistor N5 is coupled between the sensing node SO and a fourth node QM_N. A second transmission (Tx) signal TRANM is input to a gate of the fifth NMOS transistor N5. The second latch L2 is a main latch coupled between a fifth node QM and the fourth node QM_N. The second latch L2 may be used for a program operation.

The sixth NMOS transistor N6 is coupled between the fifth node QM and the third node K, and the seventh NMOS transistor N7 is coupled between the fourth node QM_N and the third node K. A second reset signal MRST is input to a gate of the sixth NMOS transistor N6, and a second set signal MSET is input to a gate of the seventh NMOS transistor N7. The sixth and seventh NMOS transistors N6 and N7 may operate to change data of the second latch L2.

The eighth NMOS transistor N8 is coupled between the sensing node SO and a sixth node QT_N. A third transmission (Tx) signal TRANT is input to a gate of the eighth NMOS transistor N8. The third latch L3 is a temporary latch coupled between a seventh node QT and the sixth node QT_N. The third latch L3 may be used for a program operation.

The ninth NMOS transistor N9 is coupled between the seventh node QT and the third node K, and the tenth NMOS transistor N10 is coupled between the sixth node QT_N and the third node K. A third reset signal TRST is input to a gate of the ninth NMOS transistor N9, and a third set signal TSET is input to a gate of the tenth NMOS transistor N10. The ninth and tenth NMOS transistors N9 and N10 may be used to change data of the third latch L3.

The eleventh NMOS transistor N11 is coupled between the sensing node SO and an eighth node QF_N. A fourth transmission (Tx) signal TRANTF is input to a gate of the eleventh transistor N11. The fourth latch L4 is a flag latch coupled between a ninth node QF and the eighth node QF_N.

The twelfth NMOS transistor N12 is coupled between the ninth node QF and the third node K. The thirteenth NMOS transistor N13 is coupled between the eighth node QF_N and the third node K. A fourth reset signal FRST is input to a gate of the twelfth NMOS transistor N12, and a fourth set signal FSET is input to a gate of the thirteenth NMOS transistor N13. The twelfth and thirteenth NMOS transistors N12 and N13 may be used to change flag data of the fourth latch L4.

A method for operating the above-mentioned semiconductor device according to an embodiment will hereinafter be described with reference to FIGS. 4 and 5.

Figure 4:
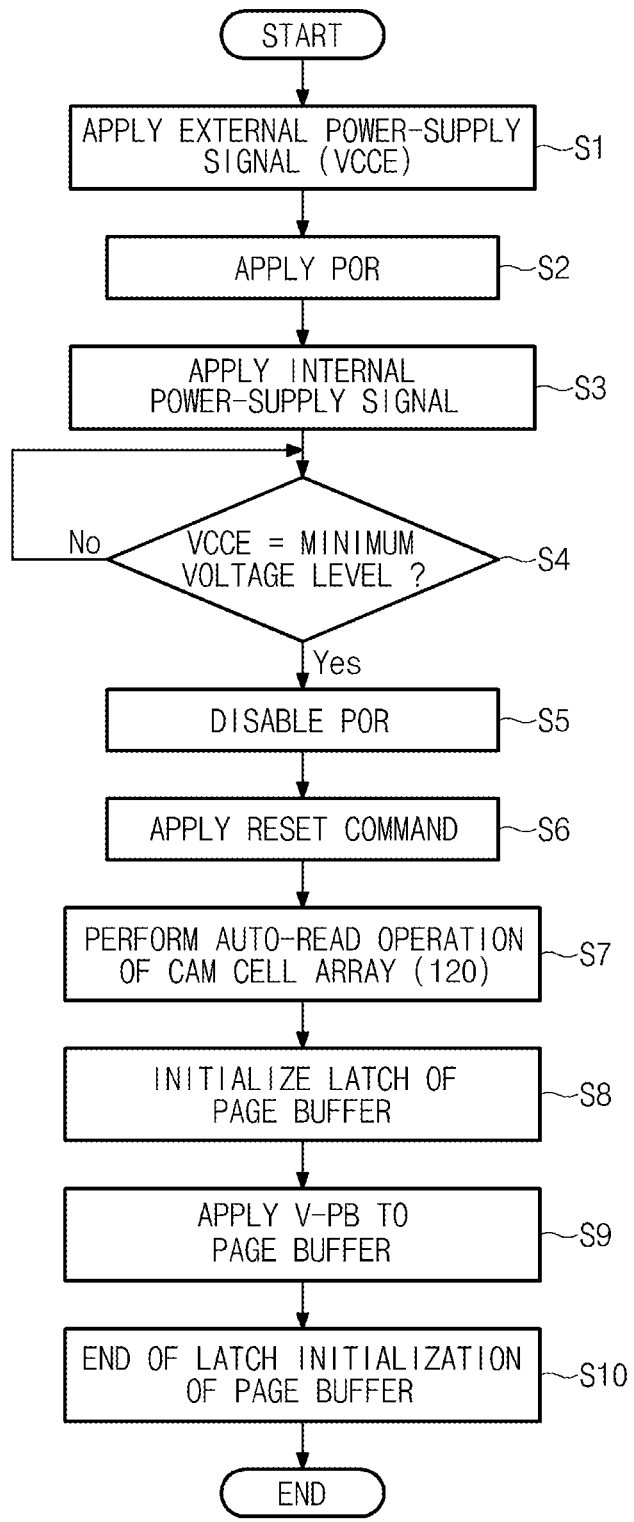
FIG. 4 is a flowchart illustrating a method for operating the semiconductor device according to an embodiment.

FIG. 4 is a flowchart illustrating a method for operating the semiconductor device according to an embodiment. FIG. 5 is a timing diagram of waveforms illustrating a method for operating the semiconductor device according to an embodiment.

If a power-on operation is performed, internal operations of the semiconductor device are started so that the semiconductor device enters a busy state in which the memory block 100 (see FIG. 1) begins to operate. The power-on operation may initialize the semiconductor device. The busy state indicates that a user does not input an operation command signal CMD.

At step S1, an external power-supply signal VCCE is input to the power-on reset controller 710 (see FIG. 2). At step S2, the power-on reset controller 710 outputs a power-on reset signal POR to the control logic 400 (see FIG. 1), the power-supply generator 720 (see FIG. 2), and the reset controller 730 (see FIG. 2).

In an embodiment, a voltage level of the power-on reset signal POR increases in response to the external power-supply signal VCCE. For example, the voltage level of the power-on reset signal POR increases in proportion to the external power-supply signal VCCE. The semiconductor device may not operate by the external power-supply signal VCCE as soon as the external power-supply signal VCCE is input to the semiconductor device during the power-up operation. It may be desirable that a voltage level operating the semiconductor device increases up to a predetermined level during a predetermined stabilization time, so that the semiconductor device can operate by a voltage signal of the predetermined level.

Thereafter, at step S3, the control logic 400 may provide an internal power-supply signal to the remaining peripheral circuits suitable for control the page buffer 200 (see FIG. 1) in response to the power-on reset signal POR. Since the page buffer 200 does not perform any other algorithm before receiving a reset command, a power-supply signal may not be provided to the page buffer 200. As a result, the control logic 400 controls the reset enable signal RST_EN to be kept in a disabled or deactivated state. Thus, the power-supply generator 720 does not provide the page buffer power-supply signal V_PB to the page buffer 200.

Subsequently, at step S4, the power-on reset controller 710 may determine whether the external power-supply signal VCCE is stabilized and reaches a minimum voltage level. For example, the minimum voltage level of the external power-supply signal VCCE reached by the external power-supply signal VCCE corresponds to a logic threshold voltage level. If the external power-supply signal VCCE reaches the minimum voltage level, the power-on reset controller 710 disables (or deactivates) the power-on reset signal POR at step S5.

Thereafter, if the power-supply signal VCCE is stabilized so that the chip enters a ready state, the reset command is applied to the control logic 400. The ready state indicates an idle state in which the internal operation is completed so that the semiconductor device awaits reception of an external command signal CMD. If the reset signal RESET is activated in response to the reset command, the control logic 400 may perform the reset operation at step S6.

If the reset signal RESET is activated an auto-read operation for reading data of the CAM cell array 120 (see FIG. 1) is carried out at step S7. If the auto-read operation is completed, data for the internal operation condition is read from the CAM cell array 120. For example, the internal operation condition data comprises information of a logic fuse, a redundancy column, a bad block, and the like.

Upon receiving the reset command, the control logic 400 activates the reset enable signal RST_EN to output the activated reset enable signal RST_EN. Upon receiving the activated reset enable signal RST_EN from the control logic 400, the reset controller 730 enables activates the reset control signal RST and initializes latches of the page buffer 200 at step S8.

For example, the reset control signal (RST) comprises a plurality of reset signals (e.g., CRST, MRST, TRST, FRST shown in FIG. 3) applied to latches of the page buffer 200. In FIG. 3, the reset signal CRST is a signal for initializing a cache latch L1 of the page buffer 200. The reset signal MRST is a signal for initializing a main latch L2 of the page buffer 200. The reset signal TRST is a signal for initializing a temporary latch L3 of the page buffer 200. The reset signal FRST is a signal for initializing a flag latch L4 associated with internal operations of the page buffer 200.

Thereafter, at step S9, the power-supply generator 720 outputs the page buffer power-supply signal V_PB to the page buffer 200 to operate the page buffer 200. If the page buffer power-supply signal V_PB is input to the page buffer 200, a voltage is applied to both nodes of a latch (e.g., the fourth and fifth nodes QM_N and QM of the second latch L2 in FIG. 3).

Assuming that the page buffer power-supply signal V-PB is applied to the page buffer 200 when latches of the page buffer 200 have not been initialized, bias voltages of both nodes of each latch are increased. Under this situation, if the latches of the page buffer 200 are reset, a peak current may occur in the page buffer 200. For example, the peak current may refer to a current flowing through an NMOS transistor (e.g., N3, N6, N9, or N12) when an activated reset signal (e.g., CRST, MRST, TRST, or FRST) is input to a gate of the NMOS transistor. Due to the increased voltage at a node (e.g., QC, QM, QT, or QF), a high current may flow through the NMOS transistor. Alternatively, the peak current may refer to a sum of currents flowing through the NMOS transistors (N3, N6, N9, and N12) that are combined at the third node K.

However, in an embodiment operating by the method shown in FIG. 4, the reset enable signal RST_EN has been activated to activate the reset control signal RST and initialize the page buffer 200, and then the page buffer power-supply signal V_PB is applied to the page buffer 200. As a result, an initialization current of the page buffer 200 is maintained at a sufficiently low level that a peak current does not cause the semiconductor device to malfunction. Thus, the power-up peak current ICC does not occur as shown in the timing diagram of FIG. 5.

At step 10, assuming that the reset enable signal RST_EN is disabled (or deactivated), the latch initialization operation of the page buffer 200 is ended.

CAM data read from the CAM cell array 120 may be applied to the control logic 400 through the page buffer 200 and the column decoder 300. The control logic 400 may determine a drive voltage of the voltage generator 600 on the basis of cell data for internal operation conditions. In response to a high voltage generated from the voltage generator 600, the row decoder 500 may provide a drive voltage to a row line selected from the memory block 100.

Figure 6:
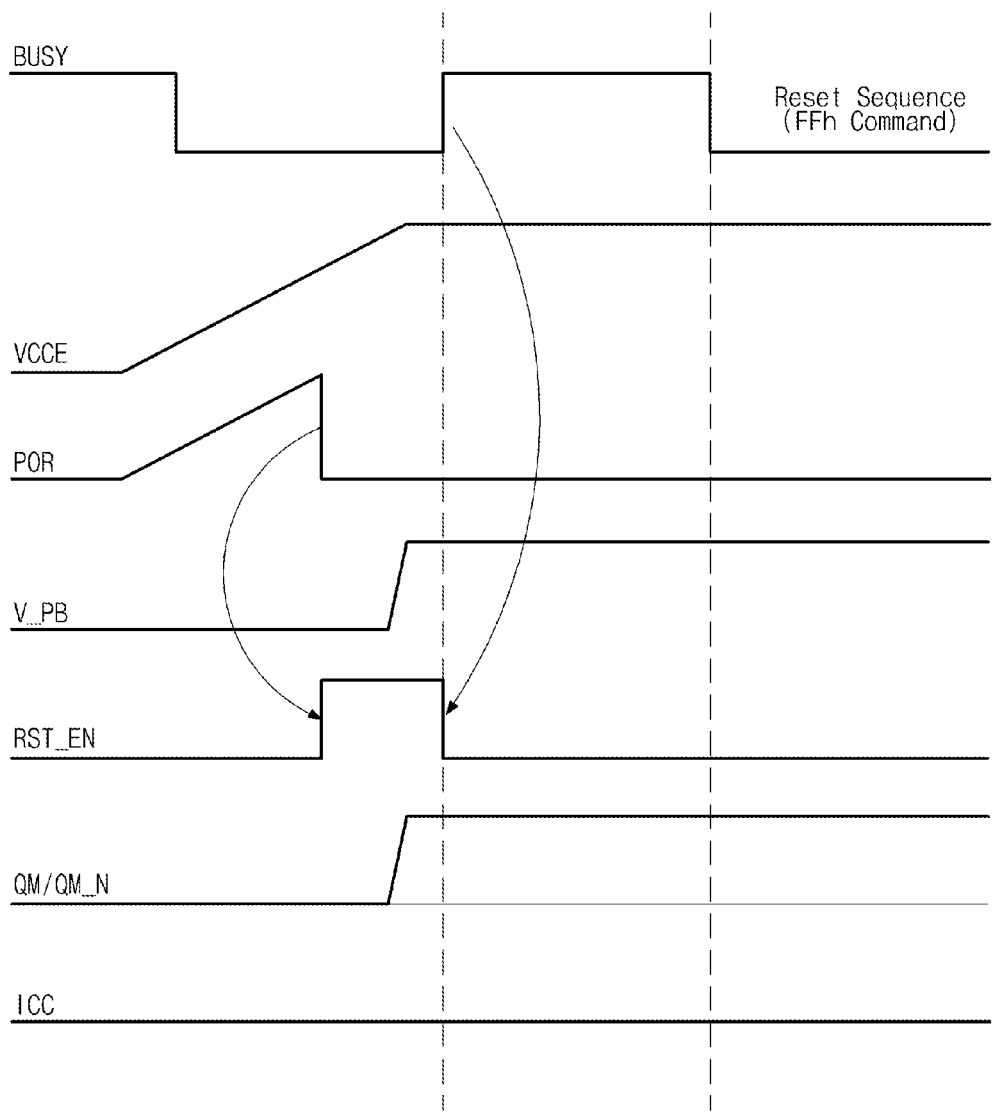
FIG. 6 is a timing diagram of waveforms illustrating a method for operating the semiconductor device according to another embodiment.

FIG. 6 is a timing diagram of waveforms illustrating a method for operating the semiconductor device according to an embodiment. Referring to FIG. 6, if a power-on operation is performed, internal operations of the semiconductor device are started so that the semiconductor device enters a busy state in which the memory block 100 (see FIG. 1) begins to operate.

Figure 5:
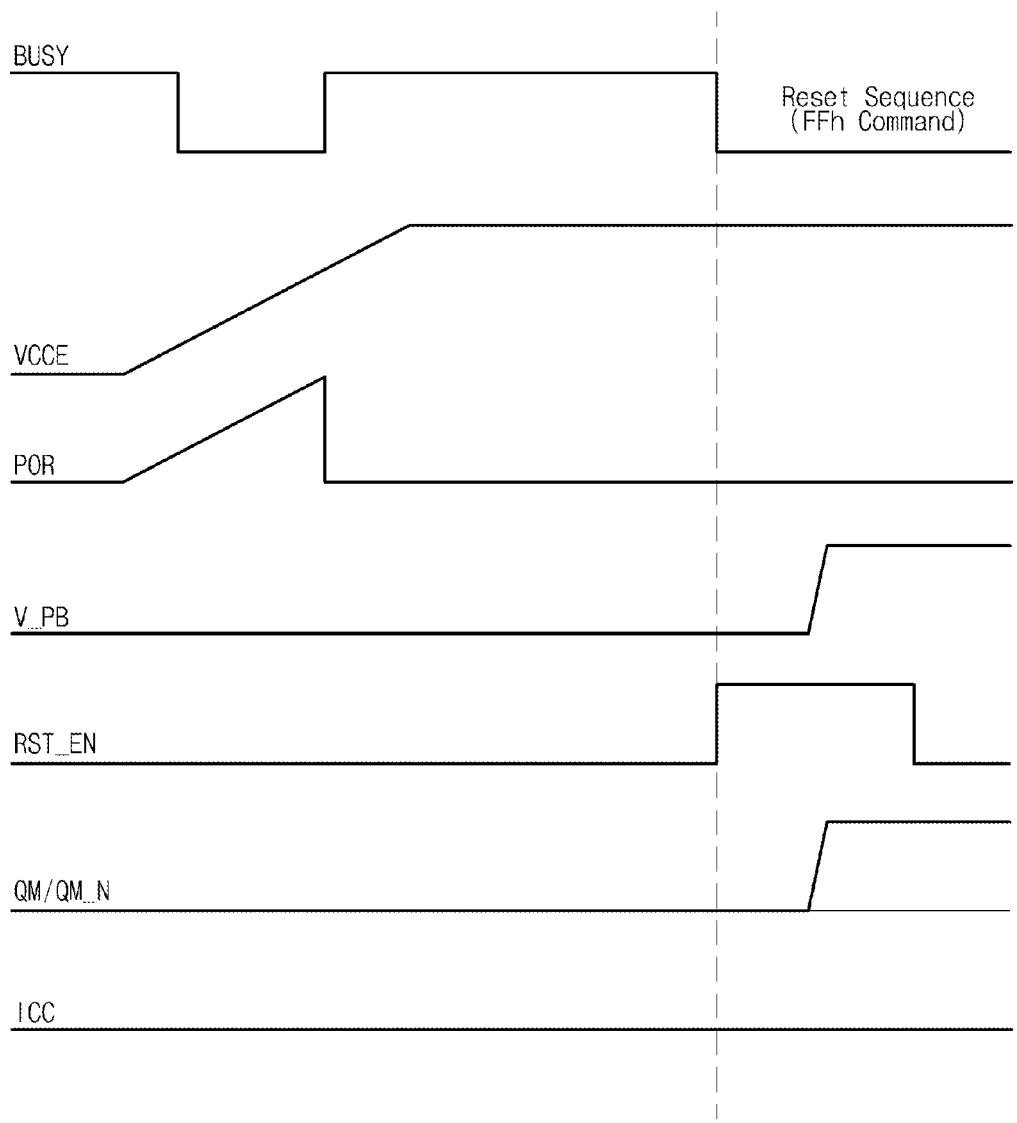
FIG. 5 is a timing diagram of waveforms illustrating a method for operating the semiconductor device according to an embodiment.

According to the embodiment shown in FIG. 5, the busy state interacts with the power-on reset signal POR. As a result, when the external power-supply signal VCCE reaches the minimum voltage level, the semiconductor device enters a ready state in which the power-on reset signal POR is automatically disabled (or deactivated).

According to the embodiment shown in FIG. 6, a ready state of a semiconductor device does not interact with the power-on reset signal POR. As a result, the semiconductor device does not enter the ready state when the power-on reset signal POR is disabled (or deactivated). Instead, when the power-on reset signal POR is disabled (or deactivated), the control logic 400 activates and outputs the reset enable signal RST_EN. After a predetermined time elapses from an input time of the reset enable signal RST_EN to initialize latches the page buffer 200, the page buffer power-supply signal V_PB is applied to the page buffer 200. Thereafter, when the command signal CMD indicating the ready state is applied to the control logic 400, the control logic 400 disables (or deactivates) the reset enable signal RST_EN.

For example, the semiconductor device according to an embodiment may comprise a flash memory device. The flash memory device is a non-volatile memory device.

With the increasing number of users who use mobile devices, for example, a cellular phone, a personal digital assistant (PDA) digital camera, a portable game console, and an MP3 player (MP3P), the flash memory devices have been widely used not only as a data storage but also as a code storage. The flash memory device can be applied to home applications, for example, a high-definition television (HDTV), a digital television (DTV), a router, a Global Positioning System (GPS), and the like.

Figure 7:
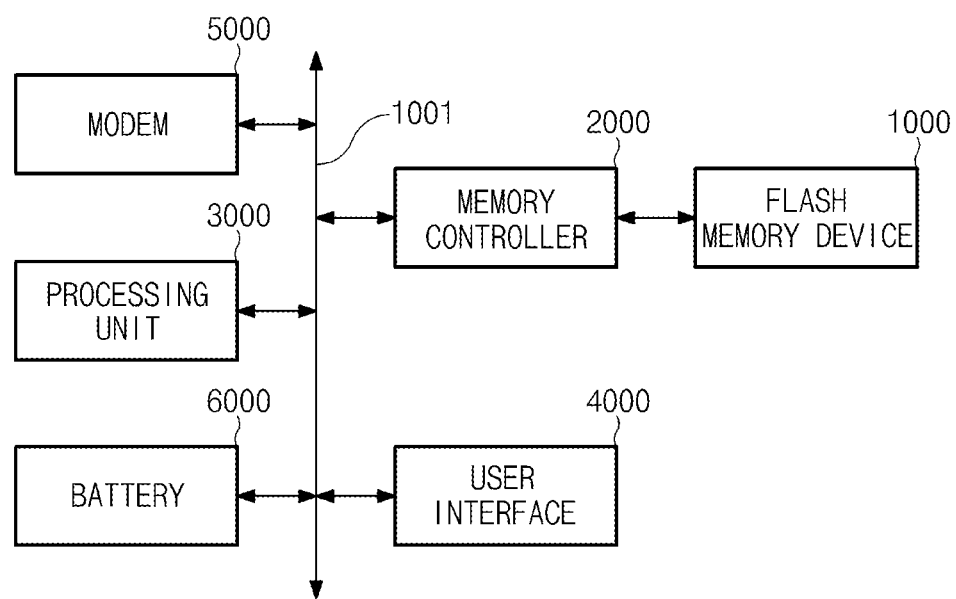
FIG. 7 is a block diagram illustrating a computing system comprising a semiconductor device according to an embodiment.

FIG. 7 is a block diagram illustrating a computing system comprising the flash memory device according to an embodiment. Referring to FIG. 7, the computing system according to this embodiment comprises a processing unit 3000 electrically coupled to a bus 1001, a user interface 4000, a modem 5000 (e.g., a baseband chipset), a memory controller 2000, and a flash memory device 1000. In an example, the processing unit 3000 comprises a microprocessor and a central processing unit (CPU).

The flash memory device 1000 may have substantially similar configuration to that of the above-mentioned embodiments of the semiconductor device. The flash memory device 1000 stores N-bit data (where N is an integer equal to or greater than 1) processed or to be processed by the processing unit 3000 through the memory controller 2000.

If the computing system of the present disclosure is a mobile device, a battery 6000 for providing an operation voltage of the computing system is additionally provided. Although not shown in FIG. 7, an application chipset, a camera image processor (CIP), a mobile DRAM, and the like can also be provided to the computing system of an embodiment.

According to the semiconductor device of the present disclosure, a power-supply input time at which the page buffer is powered on is controlled such that a peak current of the page buffer latch is reduced during the power-up operation.

Embodiments may be carried out in other ways than those specifically described herein. Embodiments are to be construed as illustrative and not restrictive.

Variations and modifications are possible in the component parts and/or arrangements in the disclosure and the drawings. Alternative uses are also possible.

What is claimed is:

1. A semiconductor device comprising:
   a memory block comprising a content addressable memory (CAM) cell array and a memory cell array, the CAM cell array that stores data for internal operation conditions of the semiconductor device;
   a page buffer that programs data in the memory block or reads the data programmed in the memory block and receives a page buffer power-supply signal after lapse of a predetermined time from initialization of latches of the page buffer;
   a control logic that activates a reset enable signal during a reset operation and outputs the activated reset enable signal; and
   a power-supply controller that activates a reset control signal to initialize the page buffer according to an external power-supply signal when the reset enable signal is activated, and provides the page buffer power-supply signal to the page buffer after the reset control signal is activated,
   wherein the power-supply controller provides the page buffer power-supply signal after initialization of the page buffer, and
   wherein the page buffer power-supply signal is generated in response to the external power-supply signal.

2. The semiconductor device according to claim 1, wherein the control logic activates the reset enable signal after a read operation of the CAM cell array is completed.

3. The semiconductor device according to claim 1, wherein the control logic activates the reset enable signal in response to a reset signal.

4. The semiconductor device according to claim 1, wherein the control logic activates the reset enable signal in response to a power-on reset signal received from the power-supply controller.

5. The semiconductor device according to claim 4, wherein the control logic activates the reset enable signal when the power-on reset signal is deactivated.

6. The semiconductor device according to claim 5, wherein the power-on reset signal is deactivated when an external power-supply signal reaches a minimum voltage level.

7. The semiconductor device according to claim 6, wherein the minimum voltage level comprises a logic threshold voltage level.

8. The semiconductor device according to claim 4, wherein the control logic deactivates the reset enable signal in response to an external command signal.

9. The semiconductor device according to claim 1, wherein the power-supply controller comprises:
   a power-on reset controller that outputs a power-on reset signal in response to an external power-supply signal;
   a reset controller that activates the reset control signal and outputs the reset control signal to the page buffer in response to the activated reset enable signal; and
   a power-supply generator that provides the page buffer power-supply signal to the page buffer.

10. The semiconductor device according to claim 1, wherein the page buffer comprises at least one of a cache latch, a main latch, a temporary latch, and a flag latch, and
   wherein the at least one of a cache latch, a main latch, a temporary latch, and a flag latch is initialized according to the reset control signal.

11. A method for operating a semiconductor device comprising:
   receiving an external power-supply signal to generate a power-on reset signal;
   activating a reset enable signal in response to a reset command;
   reading CAM data stored in a CAM cell array, the CAM data comprising data for internal operation conditions of the semiconductor device;
   initializing latches of a page buffer in response to a reset control signal that is activated according to the external power-supply signal; and
   applying a page buffer power-supply signal to the page buffer after the reset control signal is activated,
   wherein the page buffer power-supply signal is applied to the page buffer after the lapse of a predetermined time from initialization of the latches of the page buffer, and
   wherein the page buffer power-supply signal is generated in response to the external power-supply signal.

12. The method according to claim 11, wherein the page buffer comprises at least one of a cache latch, a main latch, a temporary latch, and a flag latch, the method further comprising:
   initializing the at least one of a cache latch, a main latch, a temporary latch, and a flag latch when the page buffer is initialized; and
   storing data in the at least one of a cache latch, a main latch, a temporary latch, and a flag latch in response to the page buffer power-supply signal.

13. The method according to claim 11, wherein generating the power-on reset signal comprises:
   increasing a level of the power-on reset signal in proportion to a level of the external power-supply signal; and
   deactivating the power-on reset signal when the external power-supply signal reaches a minimum voltage level.

14. A method for operating a semiconductor device comprising:
   receiving an external power-supply signal to generate a power-on reset signal;
   activating a reset enable signal when the power-on reset signal is deactivated;
   reading CAM data stored in a CAM cell array, the CAM data comprising data for internal operation conditions of the semiconductor device;
   initializing latches of a page buffer in response to a reset control signal that is activated according to the external power-supply signal; and
   applying a page buffer power-supply signal to the page buffer after the reset control signal is activated,
   wherein the page buffer power-supply signal is applied to the page buffer after lapse of a predetermined time from initialization of the latches of the page buffer, and
   wherein the page buffer power-supply signal is generated in response to the external power-supply signal.

15. The method according to claim 14, further comprising:
   deactivating the reset enable signal in response to an external command signal.

16. The method according to claim 14, further comprising:
   receiving a reset signal after applying the page buffer power-supply signal.

17. The method according to claim 14, wherein the page buffer comprises at least one of a cache latch, a main latch, a temporary latch, and a flag latch, the method further comprising:
   when the page buffer is initialized, initializing the at least one of a cache latch, a main latch, a temporary latch, and a flag latch; and
   storing data in the at least one of a cache latch, a main latch, a temporary latch, and a flag latch in response to the page buffer power-supply signal.

* * * * *